United States Patent
Park et al.

(10) Patent No.: US 11,690,275 B2
(45) Date of Patent: Jun. 27, 2023

(54) METHOD OF FABRICATING DISPLAY DEVICE

(71) Applicant: Samsung Display Co., Ltd., Yongin-si (KR)

(72) Inventors: Sungkyun Park, Hwaseong-si (KR); Jung-Moo Hong, Seongnam-si (KR); Doyeon Kim, Seoul (KR); Sanghyun Jun, Suwon-si (KR); Yejoo Jun, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 165 days.

(21) Appl. No.: 17/177,316

(22) Filed: Feb. 17, 2021

(65) Prior Publication Data

US 2021/0320284 A1 Oct. 14, 2021

(30) Foreign Application Priority Data

Apr. 13, 2020 (KR) .......................... 10-2020-0044863

(51) Int. Cl.
  *H10K 71/00* (2023.01)
  *H10K 50/844* (2023.01)

(52) U.S. Cl.
  CPC ........... *H10K 71/00* (2023.02); *H10K 50/844* (2023.02)

(58) Field of Classification Search
  CPC ....... H01L 51/56; H01L 51/5253–5256; H01L 27/3276–3279; H01L 27/3297; H03K 17/962–9622
  See application file for complete search history.

(56) References Cited

U.S. PATENT DOCUMENTS

| | | | |
|---|---|---|---|
| 2015/0107977 A1* | 4/2015 | Lee | G06F 3/0446 216/13 |
| 2018/0233541 A1* | 8/2018 | Zeng | G06F 3/0446 |
| 2018/0308903 A1* | 10/2018 | Jeong | H01L 27/3276 |
| 2019/0103443 A1* | 4/2019 | Kim | G06F 3/0412 |
| 2021/0157433 A1* | 5/2021 | Han | H01L 27/3244 |
| 2022/0028933 A1* | 1/2022 | He | H01L 27/323 |

FOREIGN PATENT DOCUMENTS

KR 10-2017-0061804 6/2017
KR 10-2019-0038719 4/2019

* cited by examiner

*Primary Examiner* — Shaun M Campbell
(74) *Attorney, Agent, or Firm* — H.C. Park & Associates, PLC

(57) ABSTRACT

Disclosed is a method of fabricating a display device. The method comprises forming a dielectric layer on an encapsulation layer including a first encapsulation region and a second encapsulation region adjacent to the first encapsulation region, forming a conductive layer on the dielectric layer, forming a first photoresist layer on the conductive layer that overlaps each of the first and second encapsulation regions, forming a second photoresist layer on the first photoresist layer that overlaps the second encapsulation region, and etching the conductive layer based on the first and second photoresist layers. When viewed in a thickness direction of a display panel including the encapsulation layer, at least a portion of the encapsulation layer overlapping the second encapsulation region has a thickness greater than that of the encapsulation layer overlapping the first encapsulation region.

11 Claims, 15 Drawing Sheets

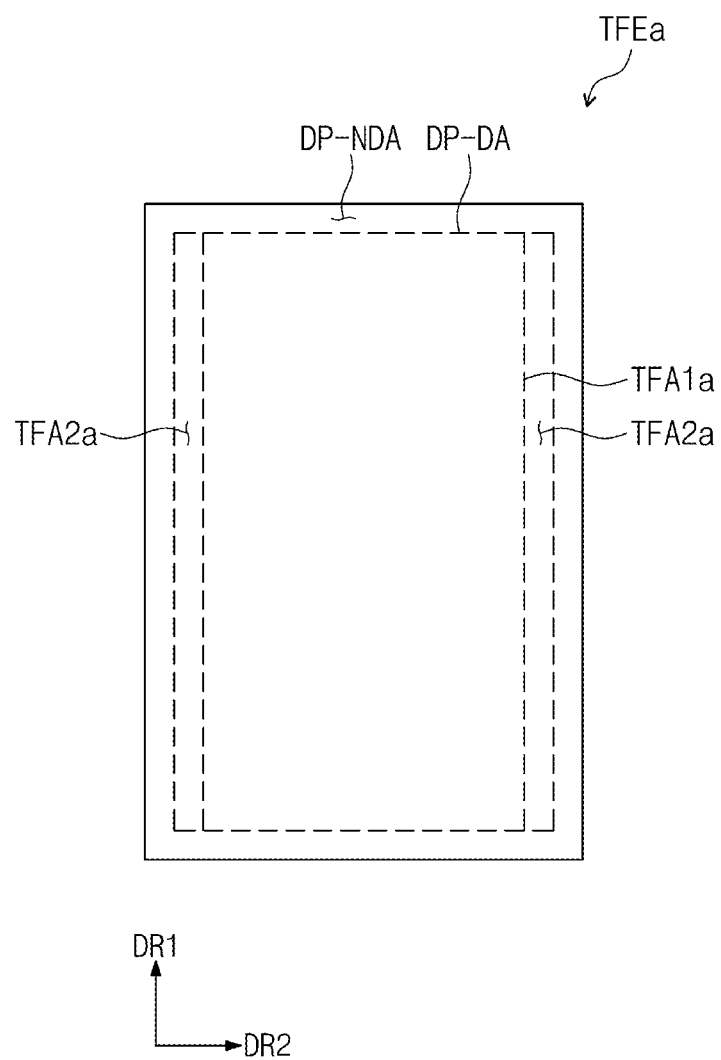

METHOD OF FABRICATING DISPLAY DEVICE

CROSS-REFERENCE TO RELATED APPLICATION

This application claims priority from and the benefit of Korean Patent Application No. 10-2020-0044863, filed on Apr. 13, 2020, which is hereby incorporated by reference for all purposes as if fully set forth herein.

BACKGROUND

Field

Exemplary embodiments/implementations of the invention relate to a display device, and more specifically, to a method of fabricating a display device.

Discussion of the Background

There have been developed a variety of display devices used for multimedia apparatuses such as televisions, mobile phones, tablet computers, navigation systems, and game consoles. Such display devices may include a display module that displays images and detects external inputs, a polarizing layer disposed on the display panel, and a window. The display module may include a display panel that displays images and an input sensing layer that detects external inputs.

An image output from the display panel may be visible through the window. The input sensing layer may detect an external input substantially approaching the window.

The above information disclosed in this Background section is only for understanding of the background of the inventive concepts, and, therefore, it may contain information that does not constitute prior art.

SUMMARY

Methods according to exemplary implementations/embodiments of the invention are capable of providing a method of fabricating a display device having an increased detectability of external inputs.

Additional features of the inventive concepts will be set forth in the description which follows, and in part will be apparent from the description, or may be learned by practice of the inventive concepts.

According to some embodiments of the present invention, a method of fabricating a display device may comprise: forming a dielectric layer on an encapsulation layer of a display panel, the encapsulation layer including a first encapsulation region and a second encapsulation region adjacent to the first encapsulation region; forming a conductive layer on the dielectric layer; forming a first photoresist layer on the conductive layer that overlaps each of the first encapsulation region and the second encapsulation region; forming a second photoresist layer on the first photoresist layer that overlaps the second encapsulation region; and etching the conductive layer based on the first photoresist layer and the second photoresist layer. When viewed in a thickness direction of the display panel, at least a portion of the encapsulation layer that overlaps the second encapsulation region may have a thickness greater than a thickness of the encapsulation layer that overlaps the first encapsulation region.

In some embodiments, the second photoresist layer may be formed by coating one or more times a photosensitive solution on the first photoresist layer that overlaps the second encapsulation region.

In some embodiments, the method may further comprise: using a mask to expose the first photoresist layer and the second photoresist layer; and developing the exposed first and second photoresist layers. The conductive layer may be etched to form a first conductive pattern that overlaps the first encapsulation region and a second conductive pattern that overlaps the second encapsulation region.

In some embodiments, at least a portion of the second conductive pattern may have a line-width greater than a line-width of the first conductive pattern. A sum of thicknesses of the first and second photoresist layers that overlap the at least a portion of the second conductive pattern may be greater than a thickness of the first photoresist layer that overlaps the first encapsulation region.

In some embodiments, the second conductive pattern may include: a first part that has a first line-width; and a second part that has a second line-width greater than the first line-width. A sum of thicknesses of the first and second photoresist layers that overlap the second part may be greater than a sum of thicknesses of the first and second photoresist layers that overlap the first part.

In some embodiments, the first part may be closer than the second part to the first conductive pattern.

In some embodiments, the display panel may define a display region and a peripheral region adjacent to the display region. The encapsulation layer may be formed to overlap the display region.

In some embodiments, when viewed in plan, the second encapsulation region may be closer than the first encapsulation region to the peripheral region.

In some embodiments, the first encapsulation region may have a planar area greater than a planar area of the second encapsulation region.

In some embodiments, when viewed in plan, the second encapsulation region may enclose the first encapsulation region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 4B illustrates a plan view showing an encapsulation layer according to some embodiments of the present invention.

DETAILED DESCRIPTION

Figure 1:
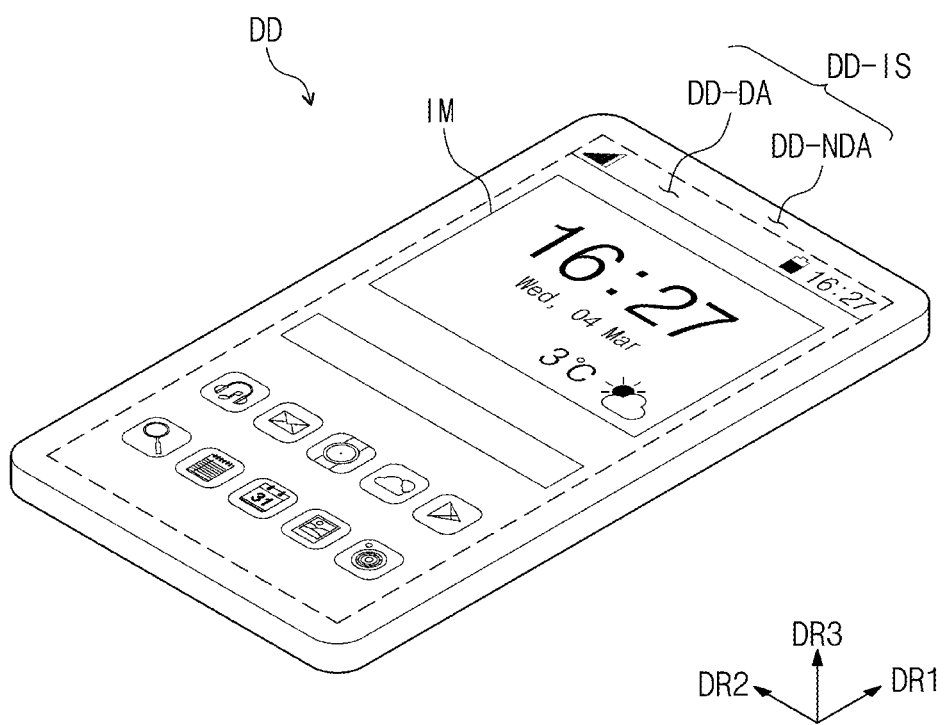
FIG. 1 illustrates a perspective view showing a display device according to some embodiments of the present invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

The following will now describe some embodiments of the present invention with reference to the accompanying drawings.

Figure 2:
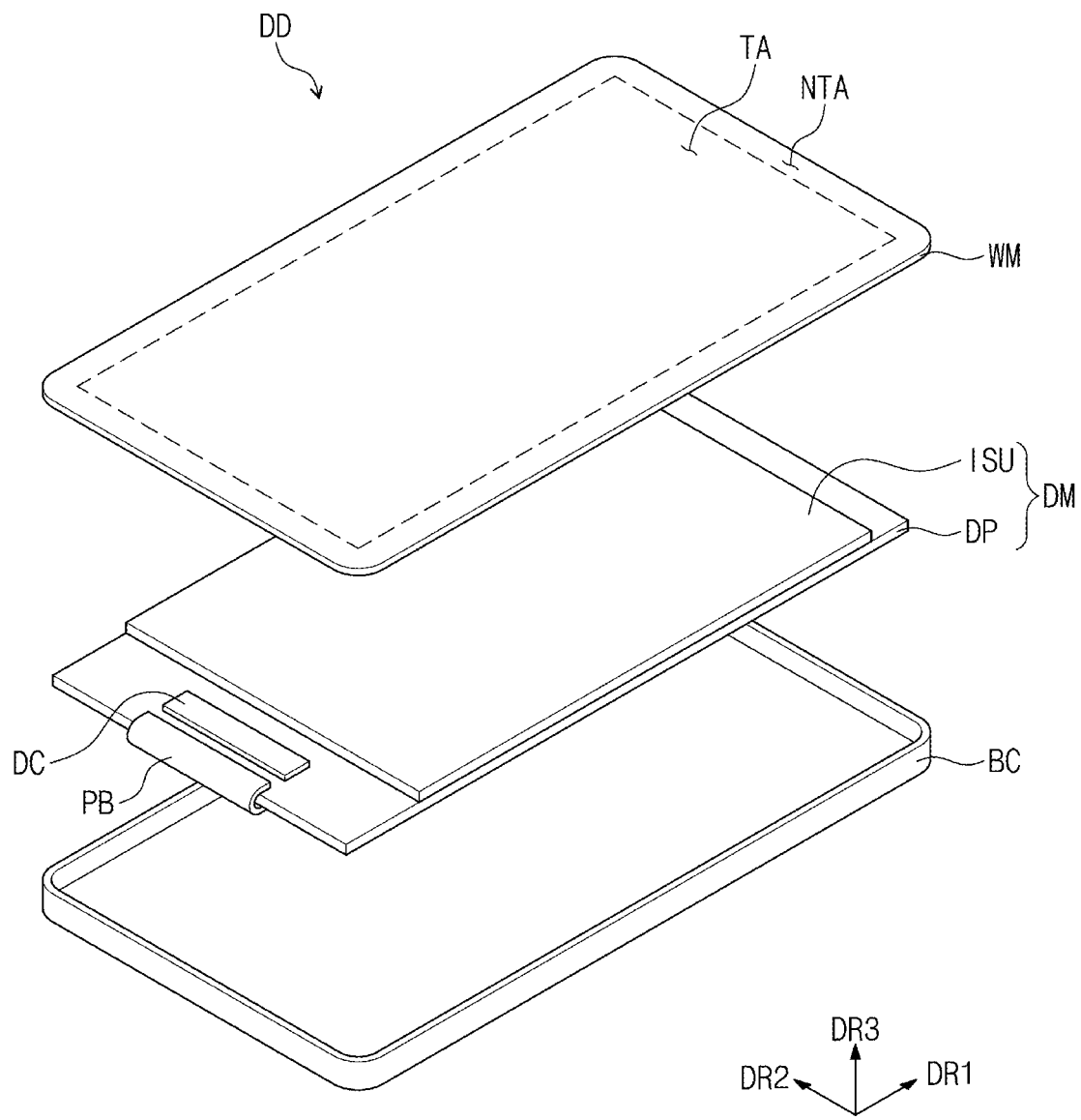
FIG. 2 illustrates an exploded perspective view showing a display device according to some embodiments of the present invention.
Figure 3:
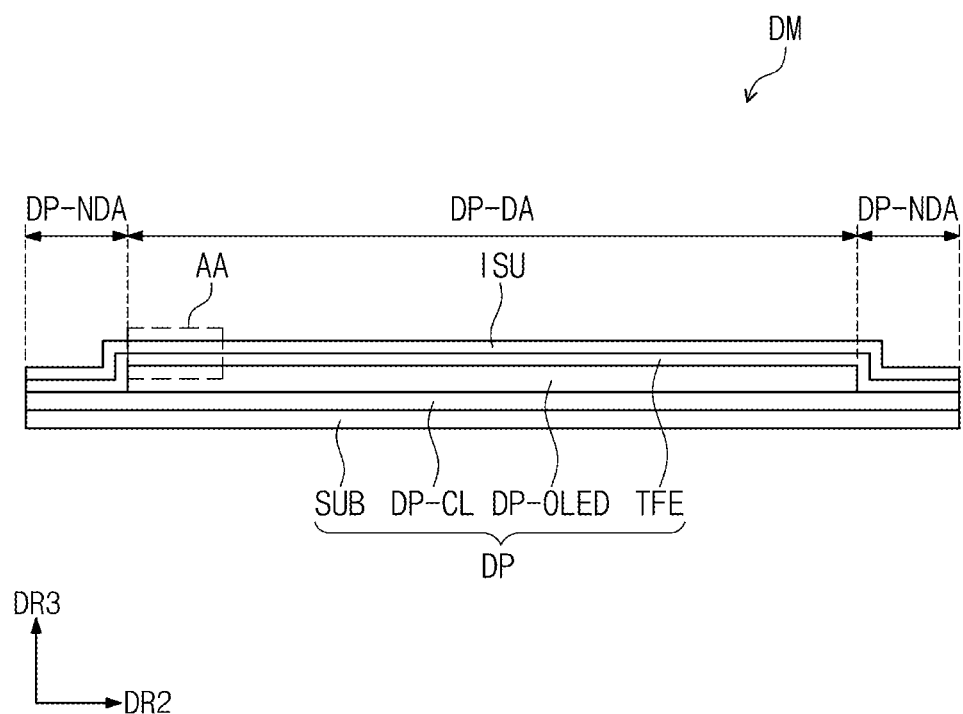
FIG. 3 illustrates a cross-sectional view showing a display module according to some embodiments of the present invention.

FIG. 1 illustrates a perspective view showing a display device according to some embodiments of the present invention. FIG. 2 illustrates an exploded perspective view showing a display device according to some embodiments of the present invention. FIG. 3 illustrates a cross-sectional view showing a display module according to some embodiments of the present invention.

In this description, a display device DD is exemplarily illustrated which is suitable for a mobile phone terminal. Although not shown, the mobile phone terminal may be configured to include the display device DD in a bracket/casing which accommodates a mainboard on which are installed electronic modules, a camera module, a power module, and the like. The display device DD according to an embodiment of the present invention may be applicable not only to large-sized electronic products such as television sets and monitors, but to small and medium-sized electronic products such as tablet computers, automotive navigation systems, game consoles, and smart watches.

Referring to FIG. 1, the display device DD may display an image IM on a display surface DD-IS. Icon images are illustrated as an example of the image IM. The display surface DD-IS is parallel to a plane defined by a first direction DR1 and a second direction DR2. A third direction DR3 indicates a normal direction to the display surface DD-IS or denotes a thickness direction of the display device DD. In this description, the phrase "when viewed in plan" or "when viewed on a plane" may mean "when viewed in the third direction DR3." The third direction DR3 differentiates front and rear surfaces (or top and bottom surfaces) of each layer or unit which will be discussed below. However, directions indicated by the first, second, and third directions DR1, DR2, and DR3 are relative concepts and may represent respective opposite directions.

The display surface DD-IS includes a display region DD-DA on which the image IM is displayed and a non-display region DD-NDA adjacent to the display region DD-DA. The non-display region DD-NDA is a zone on which no image is displayed. The present invention, however, is not limited thereto, and the non-display region DD-NDA may be adjacent to one side of the display region DD-DA or may be omitted.

Referring to FIG. 2, the display device DD may include a window WM, a display module DM, a driver chip DC, a circuit board PB, and an accommodation member BC. The accommodation member BC may receive the display module DM and may combine with the window WM.

The window WM may be disposed above the display module DM, and may externally transmit an image provided from the display module DM. The window WM includes a transmission region TA and a non-transmission region NTA. The transmission region TA may overlap the display region DD-DA and may have a shape that corresponds to that of the display region DD-DA. The image IM displayed on the display region DD-DA of the display device DD may be externally visible through the transmission region TA of the window WM.

The non-transmission region NTA may overlap the non-display region DD-NDA and may have a shape that corresponds to that of the non-display region DD-NDA. The non-transmission region NTA may be a zone whose optical transmittance is relatively less than that of the transmission region TA. The technical concepts of the present invention, however, are not limited thereto, and the non-transmission region NTA may be omitted.

The window WM may be formed of glass, sapphire, or plastic. Although the window WM is illustrated as a single layer, the window WM may include a plurality of layers. The window WM may include a base layer and at least one printed layer that overlaps the non-transmission region NTA and is disposed on a rear surface of the base layer. The printed layer may have a certain color. For example, the printed layer may have either a black color or any color other than the black color.

The display module DM is disposed between the window WM and the accommodation member BC. The display module DM includes a display panel DP and an input sensing layer ISU. The display panel DP may generate an image and may transfer the generated image to the window WM.

According to some embodiments of the present invention, the display panel DP may be an emissive display panel and is not particularly limited in its type. For example, the display panel DP may be an organic light emitting display panel or a quantum-dot light emitting display panel. An emission layer of an organic light emitting display panel may include an organic light emitting material. An emission layer of the quantum-dot light emitting display panel may include a quantum-dot or a quantum-rod. The following will discuss an example in which an organic light emitting display panel is adopted as the display panel DP.

The following will explain an example where an organic light emitting display panel is adopted as the display panel DP according to an embodiment of the present invention. The technical concepts of the present invention, however, are not limited thereto, and based on embodiments, various types of display panels are applicable to the present invention.

Referring to FIG. 3, the display panel DP includes a base layer SUB and also includes a circuit element layer DP-CL, a display element layer DP-OLED, and an encapsulation layer TFE all of which are disposed on the base layer SUB.

The display panel DP includes a display region DP-DA and a peripheral region DP-NDA. The display region DP-DA of the display panel DP corresponds either to the display region DD-DA shown in FIG. 1 or to the transmission region TA shown in FIG. 2, and the peripheral region DP-NDA of the display panel DP corresponds either to the non-display region DD-NDA shown in FIG. 1 or to the non-transmission region NTA shown in FIG. 2.

The base layer SUB may include at least one plastic film. The base layer SUB may include a flexible substrate, for example, at least one selected from a plastic substrate, a glass substrate, a metal substrate, and an organic/inorganic composite substrate.

The circuit element layer DP-CL includes at least one intermediate dielectric layer and a circuit element. The intermediate dielectric layer includes at least one intermediate inorganic layer and at least one intermediate organic layer. The circuit element includes signal lines and a pixel driver circuit.

The display element layer DP-OLED includes a plurality of organic light emitting diodes. The display element layer DP-OLED may further include an organic layer such as a pixel definition layer. According to some embodiments, when the display panel DP is provided in the type of a liquid crystal display panel, the display element layer DP-OLED may be provided in the type of a liquid crystal layer.

The encapsulation layer TFE encapsulates the display element layer DP-OLED. For example, the encapsulation layer TFE may be a thin-film encapsulation layer. The encapsulation layer TFE may include at least one dielectric layer. The encapsulation layer TFE protects the display element layer DP-OLED against foreign substances such as moisture, oxygen, and dust particles.

The input sensing layer ISU may be disposed between the window WM and the display panel DP. The input sensing layer ISU detects an externally applied input. The externally applied input may be provided in various types. For example, the external input includes a user's body part, a stylus pen, light, heat, pressure, or any various types of external input. In addition, the external input may not only include a user's touch such as user's hands, but may also include an approaching or proximal spatial touch (e.g., hovering touch).

The input sensing layer ISU may be directly disposed on the display panel DP. In this disclosure, the phrase "A is directly disposed on B" means that no adhesive layer is disposed between A and B. In some embodiments, the input sensing layer ISU and the display panel DP may be fabricated in a successive process. The technical concepts of the present invention, however, are not limited thereto. The input sensing layer ISU may be provided as an individual panel, and may be coupled through an adhesive layer to the display panel DP.

Referring back to FIG. 2, the driver chip DC may be disposed on the display panel DP, while overlapping the non-display region DD-NDA shown in FIG. 1. For example, in response to control signals transferred from the circuit board PB, the driver chip DC may generate driving signals required for operation of the display panel DP. The driver chip DC may transfer the generated driving signals to the circuit element layer DP-CL of the display panel DP. In this description, the driver chip DC may be explained as an electronic component.

The circuit board PB may be disposed at an end of the base layer SUB and electrically connected to the circuit element layer DP-CL. The circuit board PB may be rigid or flexible. For example, when the circuit board PB is flexible, flexible printed circuit board may be provided as the circuit board PB. The circuit board PB may include a timing control circuit that controls operation of the display panel DP. The timing control circuit may be provided in the type of an integrated circuit chip mounted on the circuit board PB. In addition, the circuit board PB may include an input sensing circuit that controls the input sensing layer ISU.

Figure 4A:
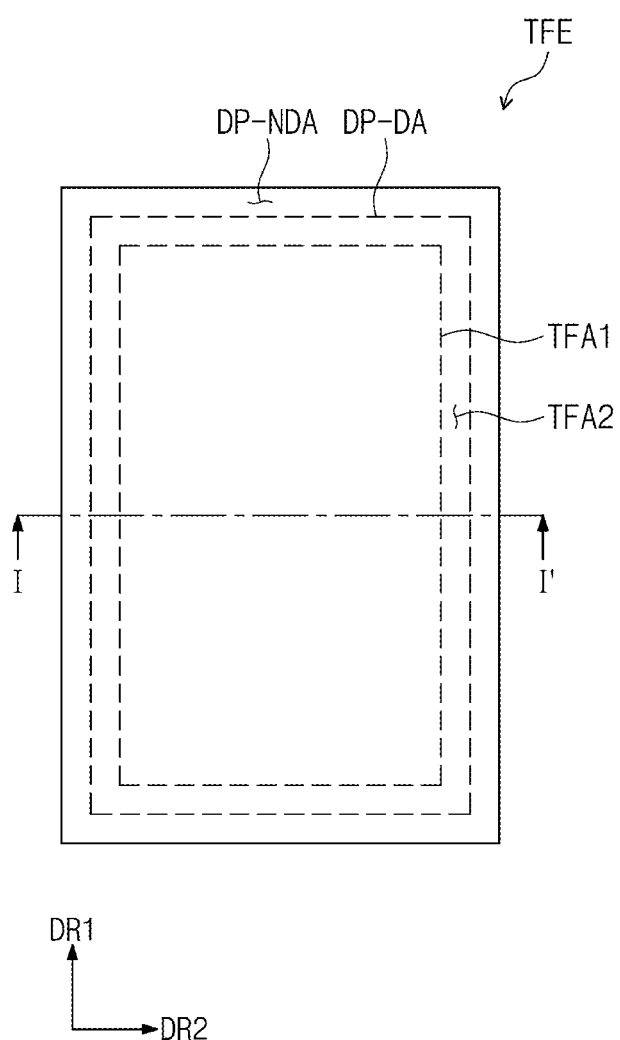
FIG. 4A illustrates a plan view showing an encapsulation layer according to some embodiments of the present invention.
Figure 4C:
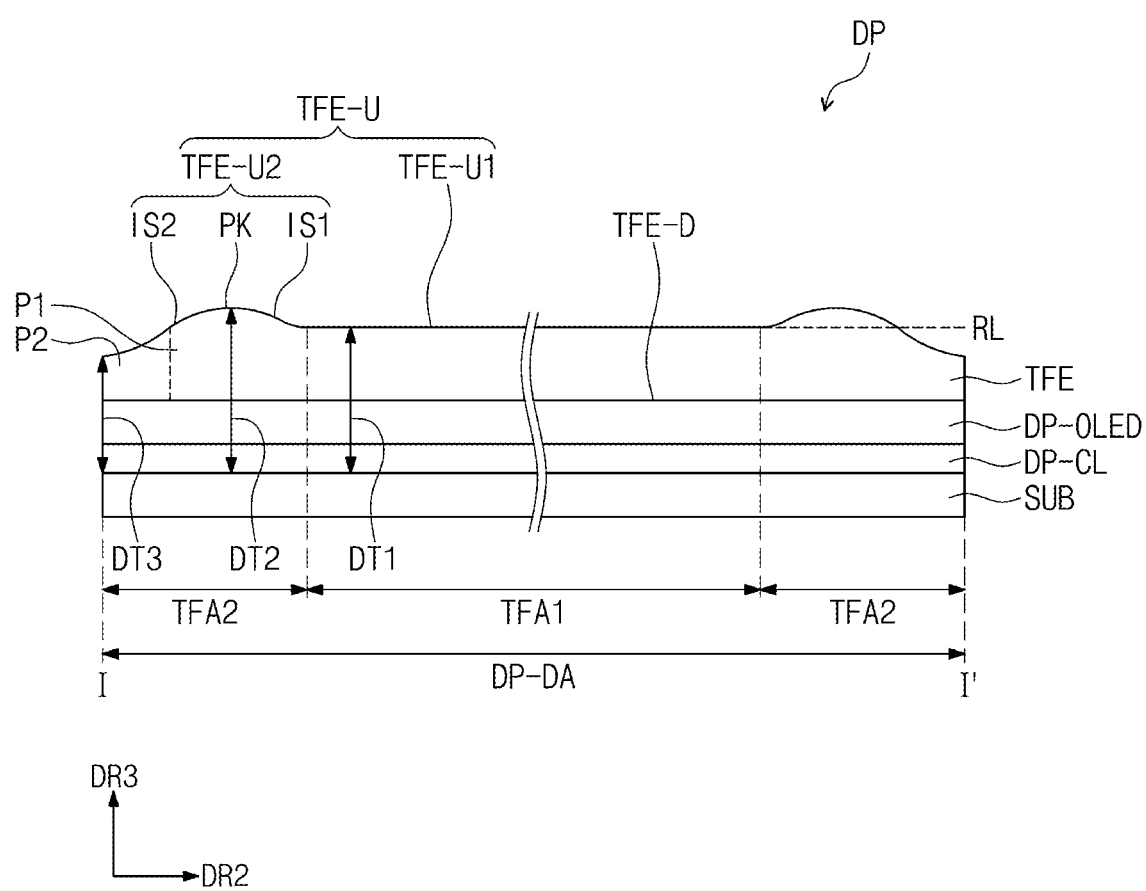
FIG. 4C illustrates a cross-sectional view taken along line I-I' of FIG. 4A according to some embodiments of the present invention.

FIG. 4A illustrates a plan view showing an encapsulation layer according to some embodiments of the present invention. FIG. 4B illustrates a plan view showing an encapsulation layer according to some embodiments of the present invention. FIG. 4C illustrates a cross-sectional view taken along line I-I' of FIG. 4A according to some embodiments of the present invention.

FIGS. 4A and 4B briefly show a relationship between the encapsulation layer TFE, the display region DP-DA, and the peripheral region DP-NDA.

The encapsulation layer TFE defines a first encapsulation region TFA1 and a second encapsulation region TFA2 that, when viewed in plan, encloses the first encapsulation region TFA1. The first encapsulation region TFA1 may have a planar area greater than that of the second encapsulation region TFA2.

According to some embodiments of the present invention, when viewed in plan, the first and second encapsulation regions TFA1 and TFA2 may overlap the display region DP-DA. The second encapsulation region TFA2 may be disposed between the peripheral region DP-NDA and the first encapsulation region TFA1, when viewed in plan. The second encapsulation region TFA2 may be closer than the first encapsulation region TFA1 to the peripheral region DP-NDA.

An encapsulation layer TFEa of FIG. 4B differs from the encapsulation layer TFE of FIG. 4A in that a position relationship between a first encapsulation region TFA1a and a second encapsulation region TFA2a.

Referring to FIG. 4B, when viewed in the second direction DR2, the second encapsulation region TFA2a may be disposed on opposite lateral surfaces of the first encapsulation region TFA1a. For example, as shown in FIG. 4B, the second encapsulation region TFA2a, the first encapsulation region TFA1a, and the second encapsulation region TFA2a may be sequentially arranged along the second direction DR2.

The arrangement of first and second encapsulation regions is not limited to that exemplarily explained above in FIG. 4A or 4B. For example, the second encapsulation region may be disposed either on only one side or on three sides of the first encapsulation region.

Referring to FIG. 4C, the encapsulation layer TFE may be divided into the first encapsulation region TFA1 and the second encapsulation region TFA2 as shown in FIG. 4A.

The encapsulation layer TFE has a bottom surface TFE-D and a top surface TFE-U. The bottom surface TFE-D of the encapsulation layer TFE may face the display element layer DP-OLED, and the top surface TFE-U of the encapsulation layer TFE may face the input sensing layer ISU shown in FIG. 3. For example, the input sensing layer ISU may be formed or otherwise disposed on the top surface TFE-U of the encapsulation layer TFE.

The top surface TFE-U of the encapsulation layer TFE includes a first top surface TFE-U1 that overlaps the first encapsulation region TFA1 and a second top surface TFE-U2 that overlaps the second encapsulation region TFA2.

The first top surface TFE-U1 may be parallel to a top surface of the base layer SUB. When the display panel DP has a flat shape, the first top surface TFE-U1 and the base layer SUB may all have a flat shape. Alternatively, when the display panel DP is curved along a certain direction, the first top surface TFE-U1 and the base layer SUB may all have a shape curved along the certain direction.

In this description, the phrase "is parallel" does not always mean "parallel (two lines do not meet each other, whatever they extend)" defined in dictionaries. For example, the first top surface TFE-U1 may have an uneven top surface. In this description, when viewed in cross-section, a reference surface (not shown) is defined which is literally parallel to the base layer SUB. The first top surface TFE-U1 may fluctuate with respect to the reference surface in a direction away from and toward the base layer SUB, while extending along the reference surface. A difference in distance between the first top surface TFE-U1 and the base layer SUB may be zero or fall within a certain range of error. The certain range of error may be less than about several nanometers.

According to an embodiment of the present invention, the second top surface TFE-U2 may convexly protrude in a direction away from the base layer SUB, for example, in the third direction DR3. For example, the second top surface TFE-U2 may protrude from a reference surface RL, which extends from the first top surface TFE-U1, in a direction (e.g., the third direction DR3) away from the base layer SUB.

In some embodiments, a part P1 of the encapsulation layer TFE that overlaps the second encapsulation region TFA2 may have a thickness greater than a thickness of the encapsulation layer TFE that overlaps the first encapsulation region TFA1. In addition, another part P2 of the encapsulation layer TFE that overlaps the second encapsulation region TFA2 may have a thickness less than a thickness of the encapsulation layer TFE that overlaps the first encapsulation region TFA1.

A first distance DT1 may be provided between the first top surface TFE-U1 and the base layer SUB. For example, as the first top surface TFE-U1 is parallel to the base layer SUB, a distance between the base layer SUB and any point on the first top surface TFE-U1 may be substantially the same within a certain range of error.

In this description, the term "distance" indicates a distance measured in a direction parallel to the third direction DR3, or to a thickness direction of the display panel DP. When the display panel DP is curved, the term "distance" may be a distance measured along a direction normal to a tangent line at a measured point.

A distance between the second top surface TFE-U2 and the base layer SUB may have various values within a range from a second distance DT2 greater than the first distance DT1 to a third distance DT3 less than the first distance DT1. For example, the second top surface TFE-U2 and the base layer SUB may have therebetween the second distance DT2 as a maximum distance and the third distance DT3 as a minimum distance. The thickness of the part P1 of the encapsulation layer TFE may correspond to the second distance DT2, and the thickness of the another part P2 of the encapsulation layer TFE may correspond to the third distance DT3.

The second top surface TFE-U2 may include a peak PK, a first inclined surface IS1, and a second inclined surface IS2. The peak PK may be defined to refer to a region on the second top surface TFE-U2 spaced apart at the second distance DT2 from the base layer SUB. For example, the peak PK may be a region having the largest distance from the base layer SUB. When viewed in the second direction DR2, the first inclined surface IS1 may extend from the peak PK toward the first encapsulation region TFA1 and may connect the first top surface TFE-U1 to the peak PK. When viewed in the second direction DR2, the second inclined surface IS2 may extend from the peak PK in a direction away from the first encapsulation region TFA1.

Figure 5:
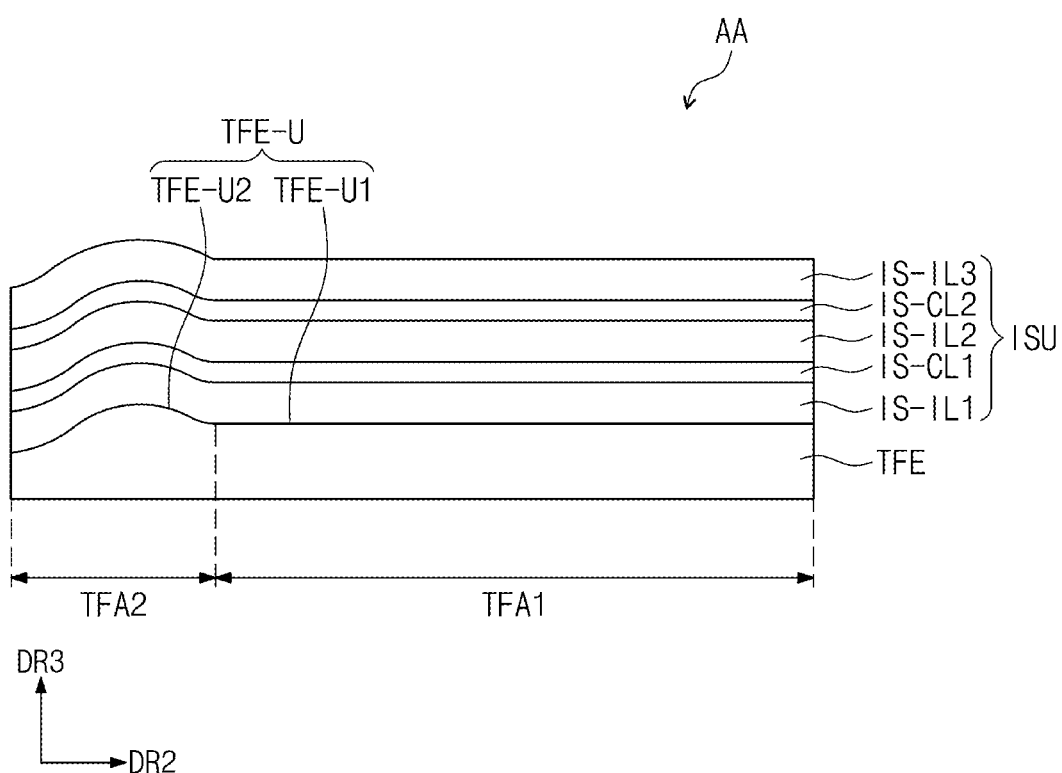
FIG. 5 illustrates a cross-sectional view of section AA of FIG. 3, showing an input sensing layer according to some embodiments of the present invention.
Figure 6A:
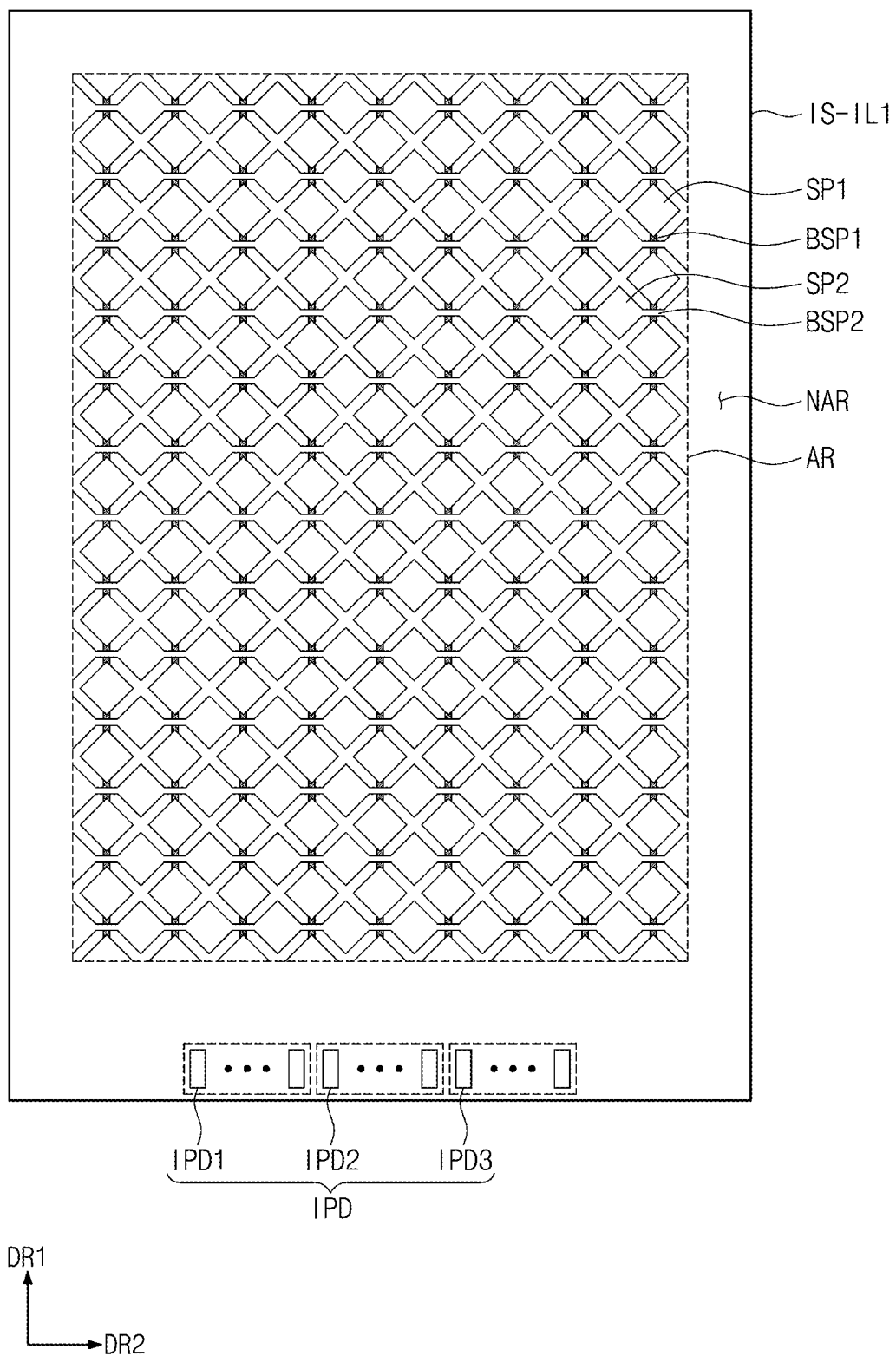
FIG. 6A illustrates a plan view showing an input sensing layer according to some embodiments of the present invention.
Figure 6B:
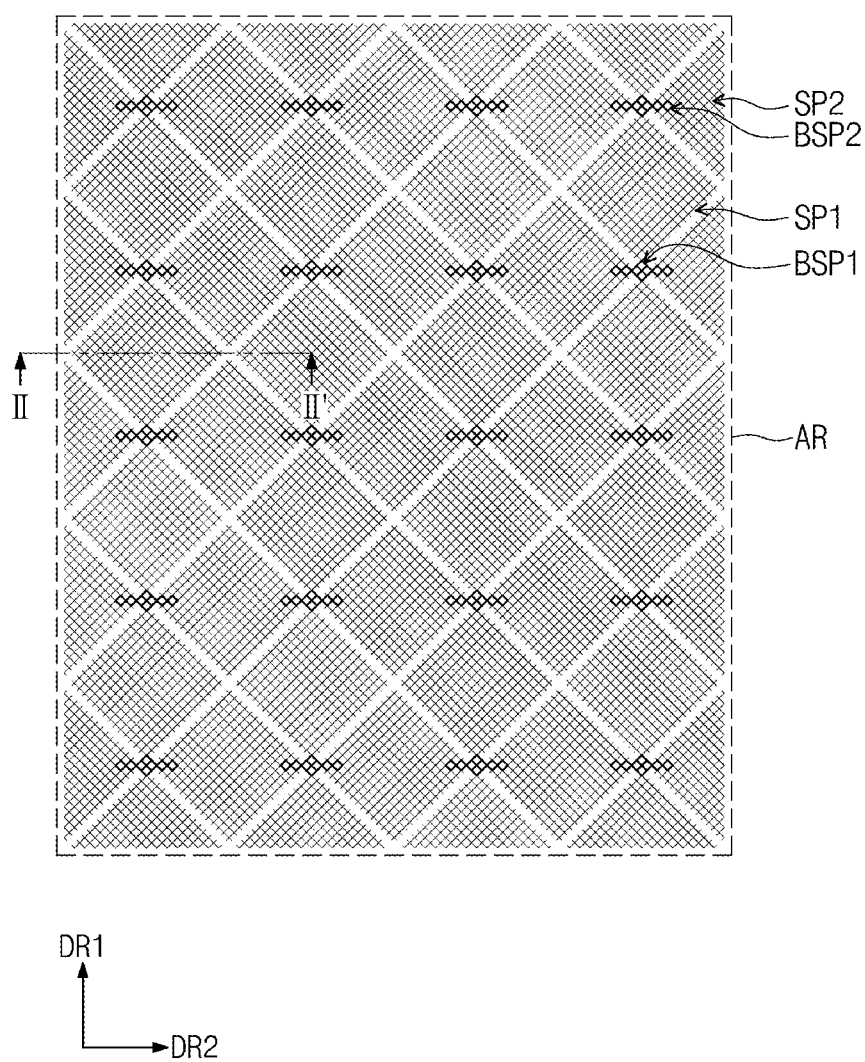
FIG. 6B illustrates a plan view showing an input sensing layer that overlaps an active region according to some embodiments of the present invention.
Figure 6C:
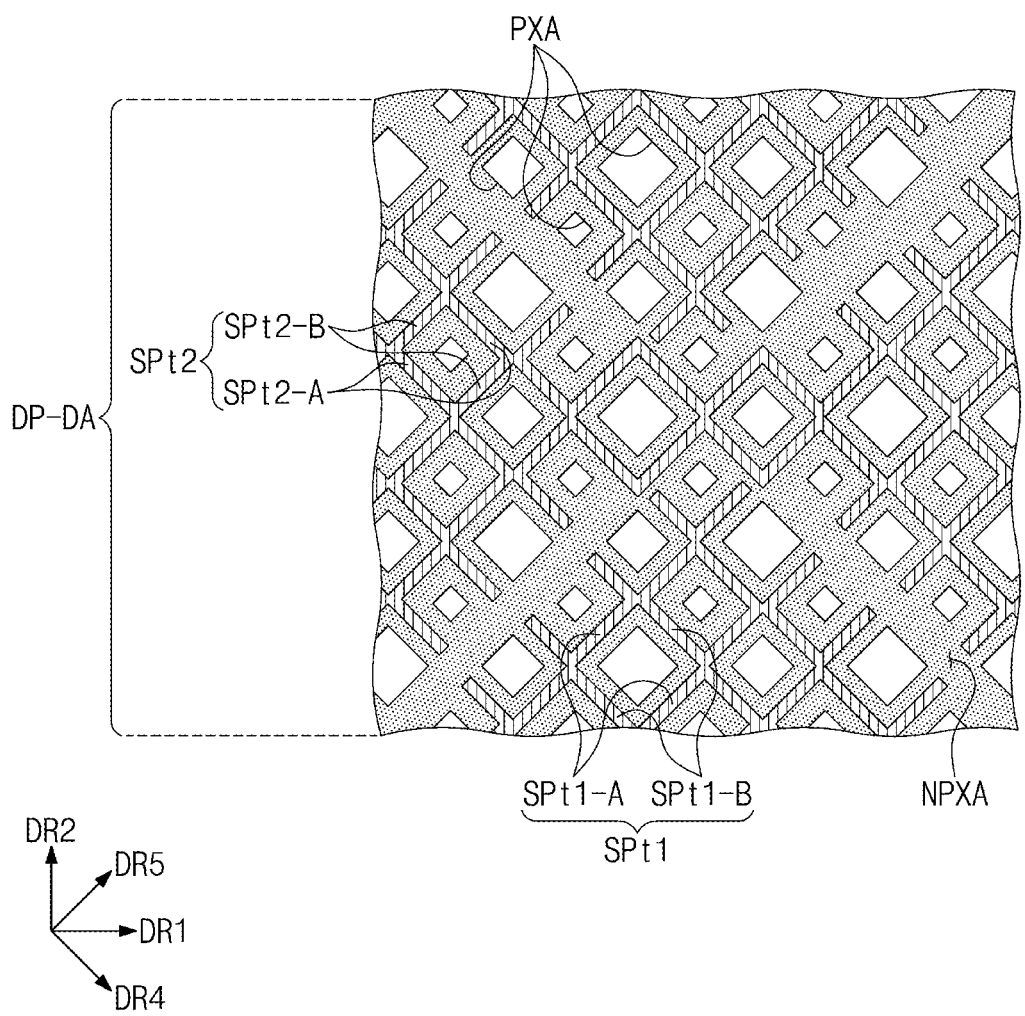
FIG. 6C illustrates a plan view partially showing an input sensing layer according to some embodiments of the present invention.

FIG. 5 illustrates a cross-sectional view of section AA of FIG. 3, showing an input sensing layer according to some embodiments of the present invention. FIG. 6A illustrates a plan view showing an input sensing layer according to some embodiments of the present invention. FIG. 6B illustrates a plan view showing an input sensing layer that overlaps an active region according to some embodiments of the present invention. FIG. 6C illustrates a plan view partially showing an input sensing layer according to some embodiments of the present invention.

Referring to FIG. 5, the input sensing layer ISU includes a first sensing dielectric layer IS-IL1, a first conductive layer IS-CL1, a second sensing dielectric layer IS-IL2, a second conductive layer IS-CL2, and a third sensing dielectric layer IS-IL3 that are sequentially stacked on the encapsulation layer TFE.

According to an embodiment of the present invention, the input sensing layer ISU may have at a partial region a curved shape that corresponds to that of the top surface TFE-U of the encapsulation layer TFE shown in FIG. 4C. For example, a flat shape may be given to the input sensing layer ISU that overlaps the first encapsulation region TFA1, and a curved shape may be given to the input sensing layer ISU that overlaps the second encapsulation region TFA2.

The first conductive layer IS-CL1 may include a connection sensing electrode and may be disposed on the first sensing dielectric layer IS-IL1. The second sensing dielectric layer IS-IL2 may be disposed on the first sensing dielectric layer IS-IL1, while covering the connection sensing electrode included in the first conductive layer IS-CL1. The second conductive layer IS-CL2 may include a sensing electrode and may be disposed on the second sensing dielectric layer IS-IL2. The third sensing dielectric layer IS-IL3 may be disposed on the second sensing dielectric layer IS-IL2, while covering the sensing electrode included in the second conductive layer IS-CL2.

According to an embodiment of the present invention, the first sensing dielectric layer IS-IL1 may be directly disposed on the encapsulation layer TFE. The technical concepts of the present invention, however, are not limited thereto. The first sensing dielectric layer IS-IL1 may be omitted, and in this case, the first conductive layer IS-CL1 may be directly disposed on the encapsulation layer TFE.

According to an embodiment of the present invention, each of the first and second conductive layers IS-CL1 and IS-CL2 may have either a single-layered structure or a multi-layered structure in which a plurality of layers are stacked along the third direction DR3. The multi-layered conductive layer may include at least two selected from transparent conductive layers and metal layers. The multi-layered conductive layer may include metal layers including different metals from each other.

The transparent conductive layer may include indium tin oxide (ITO), indium zinc oxide (IZO), zinc oxide (ZnO), indium tin zinc oxide (ITZO), PEDOT, metal nano-wires, or graphene. The metal layer may include molybdenum, silver, titanium, copper, aluminum, or any alloy thereof.

Each of the first, second, and third sensing dielectric layers IS-IL1, IS-IL2, and IS-IL3 may have a single-layered or multi-layered structure, and may have at least one selected from an inorganic layer and an organic layer.

Referring to FIG. 6A, the input sensing layer ISU includes an active region AR and an inactive region NAR adjacent to the active region AR. The active region AR may correspond to the transmission region TA of the window WM defined above in FIG. 2, and the inactive region NAR may correspond to the non-transmission region NTA of the window WM.

For example, the input sensing layer ISU includes first sensing electrodes, second sensing electrodes, first connectors BSP1, second connectors BSP2, and sensing pads IPD. The first sensing electrodes, the second sensing electrodes, the first connectors BSP1, and the second connectors BSP2 overlap the active region AR, and the sensing pads IPD overlap the inactive region NAR. The first sensing electrodes, the second sensing electrodes, and the second connectors BSP2 may correspond to the sensing electrode discussed in FIG. 5, and the first connectors BSP1 may correspond to the connection sensing electrode discussed in FIG. 5.

The first sensing electrodes may extend in the first direction DR1 and may be arranged in the second direction DR2. The number of the first sensing electrodes may be n, where n is a natural number. The first sensing electrodes include a plurality of first sensing parts SP1 that, when viewed in plan, are spaced apart from each other and are arranged in the first direction DR1.

The second sensing electrodes may extend in the second direction DR2 and may be arranged in the first direction DR1. The number of the second sensing electrodes may be m, where m is a natural number. The second sensing electrodes include a plurality of second sensing parts SP2 that, when viewed in plan, are spaced apart from each other and are arranged in the second direction DR2. When viewed in plan, the second sensing parts SP2 may be spaced apart and insulated from the first sensing parts SP1.

The first connectors BSP1 may connect the first sensing parts SP1 to each other. For example, a single first connector BSP1 may electrically connect two first sensing parts SP1 that neighbor in the first direction DR1.

The second connectors BSP2 may connect the second sensing parts SP2 to each other. For example, a single second connector BSP2 may electrically connect two second sensing parts SP2 that neighbor in the second direction DR2. According to an embodiment of the present invention, the second connectors BSP2 and the second sensing parts SP2 may have a single unitary shape formed in the same process. The first connectors BSP1 and the second connectors BSP2 may intersect each other when viewed in plan and may be insulated from each other when viewed in cross-section.

According to an embodiment of the present invention, the first sensing parts SP1, the second sensing parts SP2, and the second connectors BSP2 may be formed of the same material in the same process, and may be included in the second conductive layer IS-CL2 discussed above in FIG. 5. For example, the first sensing parts SP1, the second sensing parts SP2, and the second connectors BSP2 may be directly disposed on the second sensing dielectric layer IS-IL2.

According to an embodiment of the present invention, the first connectors BSP1 may be included in the first conductive layer IS-CL1 discussed in FIG. 5. The first connectors BSP1 may be directly disposed on the first sensing dielectric layer IS-IL1. The first connectors BSP1 may be electrically connected to the first sensing parts SP1 through contact holes defined in the first sensing dielectric layer IS-IL1.

However, components included in the first and second conductive layers IS-CL1 and IS-CL2 are not necessarily limited thereto, and may be variously changed. For example, the first sensing parts SP1, the second sensing parts SP2, and the second connectors BSP2 may be included in the first conductive layer IS-CL1, and the first connectors BSP1 may be included in the second conductive layer IS-CL2.

The sensing pads IPD include a first sensing pad IPD1, a second sensing pad IPD2, and a third sensing pad IPD3. Each of the first, second, and third sensing pads IPD1, IPD2, and IPD3 may be provided in plural.

The first sensing pads IPD1 may be connected to corresponding ends of the first sensing electrodes, and the second sensing pads IPD2 may be connected to corresponding other ends of the first sensing electrodes. The third sensing pads IPD3 may be connected to corresponding ends of the second sensing electrodes.

Although not shown in FIG. 6A, the input sensing layer ISU may include first lines that connect the first sensing pads IPD1 to the corresponding ends of the first sensing electrodes, second lines that connect the second sensing pads IPD2 to the corresponding other ends of the first sensing electrodes, and third lines that connect the third sensing pads IPD3 to the corresponding ends of the second sensing electrodes.

Referring to FIG. 6B, the first sensing parts SP1, the second sensing parts SP2, the first connectors BSP1, and the second connectors BSP2 may each be provided as a metal mesh structure to reduce the probability of being externally visible.

According to that shown in FIG. 6C, the display region DP-DA includes a plurality of pixel regions PXA and a light-shield region NPXA adjacent to the pixel regions PXA. For example, the light-shield region NPXA may enclose the pixel regions PXA. In this description, the term "pixel region" may denote a zone from which light is externally emitted through the display surface DD-IS discussed in FIG. 1.

Each of the first sensing parts SP1 includes first mesh lines SPt1 that define mesh openings. Although the first mesh lines SPt1 are illustrated to define the mesh openings, at least a portion of the first mesh lines SPt1 may define no mesh opening. For example, no mesh opening may be defined by portions of the first mesh lines SPt1 adjacent to edges of the first sensing part SP1.

Each of the second sensing parts SP2 includes second mesh lines SPt2 that define mesh openings. Likewise the first mesh lines SPt1, although the second mesh lines SPt2 are illustrated to define the mesh openings, at least a portion of the second mesh lines SPt2 may define no mesh opening.

According to some embodiments of the present invention, when viewed in plan, the mesh opening may have an area greater than that of the pixel region PXA. In addition, at least ones of a plurality of mesh openings defined by the first mesh lines SPt1 and the second mesh lines SPt2 may have different areas from each other.

Moreover, each of the first and second mesh lines SPt1 and SPt2 overlaps the light-shield region NPXA. Each of the first mesh lines SPt1 includes two first extensions SPt1-A that extend in a fifth direction DR5 intersecting the first and second directions DR1 and DR2, and also includes two second extensions SPt1-B that extend in a fourth direction DR4 intersecting the fifth direction DR5. The first extensions SPt1-A may face each other and have connections with the second extensions SPt1-B. The second extensions SPt1-B may face each other and have connections with the first extensions SPt1-A.

Each of the second mesh lines SPt2 includes two third extensions SPt2-A that extend in the fourth direction DR4 intersecting the first and second directions DR1 and DR2, and also includes two fourth extensions SPt2-B that extend in the fifth direction DR5 intersecting the fourth direction DR4. The third extensions SPt2-A may face each other and have connections with the fourth extensions SPt2-B. The fourth extensions SPt2-B may face each other and have connections with the third extensions SPt2-A.

Figure 7:
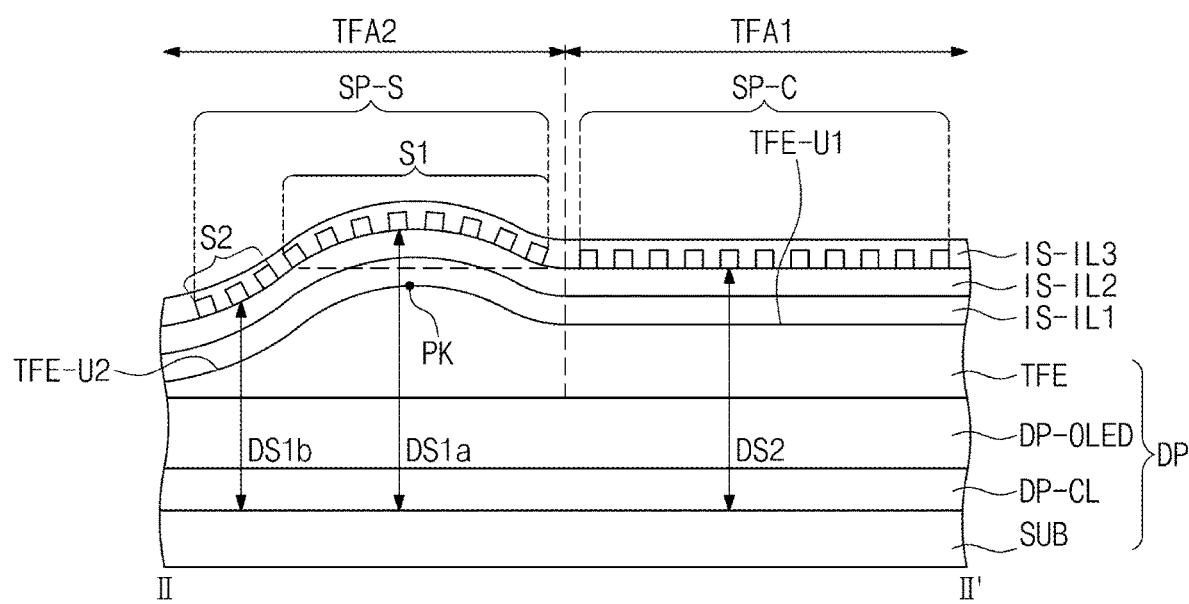
FIG. 7 illustrates a cross-sectional view taken along line II-II' of FIG. 6B according to some embodiments of the present invention.
Figure 8A:
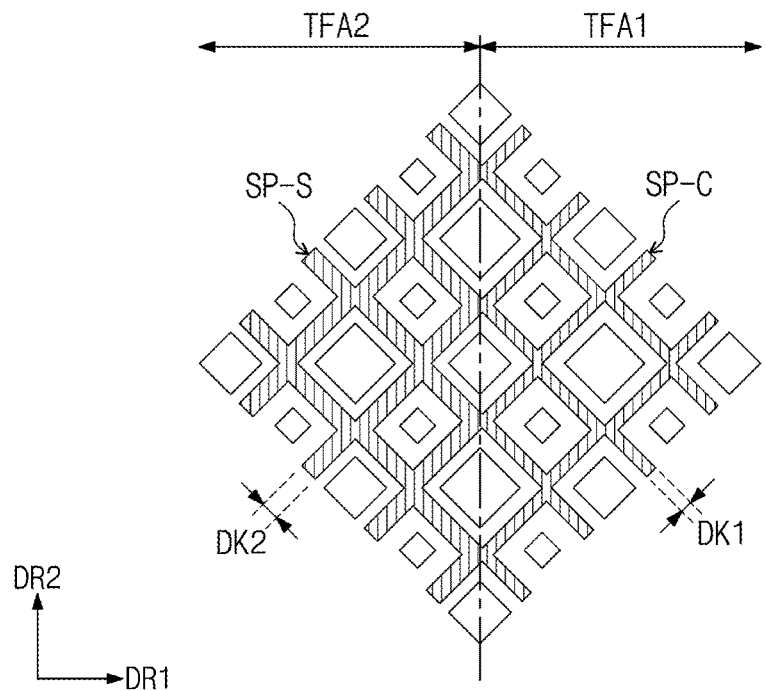
FIG. 8A illustrates an enlarged plan view partially showing a sensing electrode of FIG. 6B according to some embodiments of the present invention.
Figure 8B:
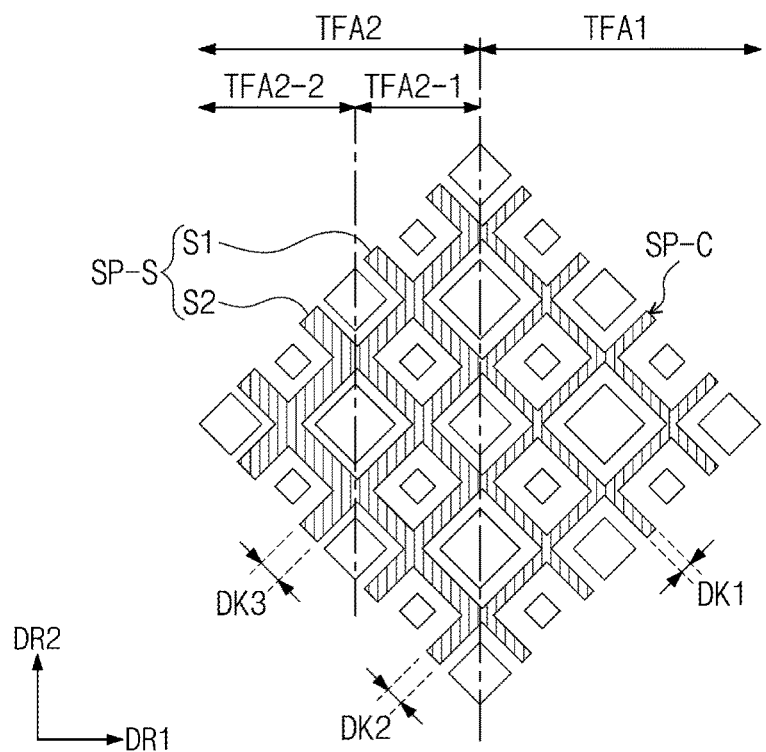
FIG. 8B illustrates an enlarged plan view partially showing a sensing electrode of FIG. 6B according to some embodiments of the present invention.

FIG. 7 illustrates a cross-sectional view taken along line II-II' of FIG. 6B according to some embodiments of the present invention. FIG. 8A illustrates an enlarged plan view partially showing a sensing electrode of FIG. 6B according to some embodiments of the present invention. FIG. 8B illustrates an enlarged plan view partially showing a sensing electrode of FIG. 6B according to some embodiments of the present invention.

Referring to FIG. 7, there is an illustration of the sensing electrode of the second conductive layer IS-CL2 disposed on the encapsulation layer TFE. For example, the sensing electrode of the second conductive layer IS-CL2 shown in FIG. 7 may denote the first sensing parts SP1 and the second sensing parts SP2 illustrated in FIG. 6A.

A first conductive pattern SP-C is explained to refer to the sensing electrode that overlaps the first encapsulation region TFA1, and a second conductive pattern SP-S is explained to refer to the sensing electrode that overlaps the second encapsulation region TFA2. The second conductive pattern SP-S may be closer than the first conductive pattern SP-C to the inactive region NAR or to the peripheral region (see DP-NDA of FIG. 3) of the display panel DP.

According to an embodiment of the present invention, the first conductive pattern SP-C may be disposed on the second sensing dielectric layer IS-IL2 having a flat shape, and the second conductive pattern SP-S may be disposed on the second sensing dielectric layer IS-IL2 having a curved shape. In addition, a width in the second direction DR2 of each of the first and second conductive patterns SP-C and SP-S may correspond to a line-width of the mesh line shown in FIG. 6C. In this description, line-widths of conductive patterns may mean line-widths of mesh lines.

When viewed in plan, the peak PK of the second encapsulation region TFA2 may overlap the second conductive pattern SP-S. When viewed in plan, a position of the peak PK may be adjusted within a region that overlaps the second conductive pattern SP-S.

According to some embodiments of the present invention, the second conductive pattern SP-S may have a line-width different from that of the first conductive pattern SP-C. The second conductive pattern SP-S, whose line-width is different from that of the first conductive pattern SP-C, may overlap one or each of the parts P1 and P2 (see FIG. 4C) of the encapsulation layer TFE.

The second conductive pattern SP-S may include a first part S1 that corresponds to the part P1 (see FIG. 4C) of the encapsulation layer TFE, and may also include a second part S2 that corresponds to the another part P2 (see FIG. 4C) of the encapsulation layer TFE. When viewed in plan, the second part S2 may be disposed farther than the first part S1 away from the first encapsulation region TFA1.

For example, according to that shown in FIG. 8A, a first line-width DK1 may be given to the first conductive pattern SP-C overlapping the first encapsulation region TFA1. A second line-width DK2 may be given to the second conductive pattern SP-S overlapping the second encapsulation region TFA2, and the second line-width DK2 may be greater than the first line-width DK1. The second conductive pattern SP-S having the second line-width DK2 may correspond to the first part S1 of the second conductive pattern SP-S and may overlap the peak PK.

In addition, the first and second parts S1 and S2 of the second conductive pattern SP-S may have different line-widths from each other. In some embodiments, according to that shown in FIG. 8B, the second line-width DK2 may be given to the first part S1 of the second conductive pattern SP-S overlapping a portion TFA2-1 of the second encapsulation region TFA2. A Third line-width DK3 may be given to the second part S2 of the second conductive pattern SP-S overlapping a another portion TFA2-2 of the second encapsulation region TFA2. The third line-width DK3 of the second part S2 may be greater than the second line-width DK2 of the first part S1. For example, the second conductive pattern SP-S may have a line-width that increases as departing from the first encapsulation region TFA1 or as approaching either the inactive region NAR or the peripheral region DP-NDA.

In this case, when viewed in the third direction DR3, a first distance DS1a between the base layer SUB and the first part S1 of the second conductive pattern SP-S may be greater than a second distance DS2 between the base layer SUB and the first conductive pattern SP-C.

In addition, a third distance DS1b between the base layer SUB and the second part S2 of the second conductive pattern SP-S may be less than the second distance DS2 between the base layer SUB and the first conductive pattern SP-C. In this case, when viewed in plan, the first part S1 of the second conductive pattern SP-S may be closer than the first part S2 of the second conductive pattern SP-S to the first encapsulation region TFA1 or to the first conductive pattern SP-C.

The technical concepts of the present invention, however, are not limited thereto, and the line-width of the second conductive pattern SP-S may be variously changed depending on a shape of the second encapsulation region TFA2. For example, in accordance with a shape of the second encapsulation region TFA2, the first part S1 of the second conductive pattern SP-S may have a line-width greater than that of the second part S2 of the second conductive pattern SP-S.

As the second encapsulation region TFA2 has a curved shape, detection reliability may decrease when an external input approaches the window (see WM of FIG. 2) that overlaps the second encapsulation region TFA2. In contrast, as discussed above, the second conductive pattern SP-S according to an embodiment of the present invention may be formed to have a line-width that is variously changed in accordance with a shape of the second encapsulation region TFA2. Accordingly, detection reliability may increase at the window (see WM of FIG. 2) that overlaps the second encapsulation region TFA2 having a curved shape.

The technical concepts of the present invention, however, are not limited thereto. For example, differently from that shown in FIG. 8A or 8B, the first conductive pattern SP-C overlapping the first encapsulation region TFA1 may have substantially the same line-width as that of the second conductive pattern SP-S overlapping the second conductive pattern SP-S.

FIGS. 9A, 9B, 9C, 9D, 9E, and 9F illustrate cross-sectional views showing a method of fabricating a display device according to some embodiments of the present invention.

Figure 9A:
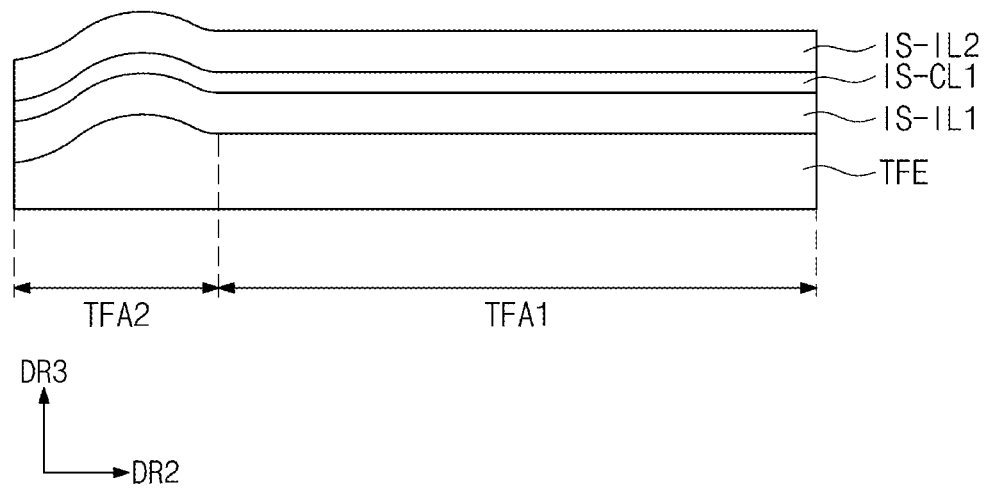
FIG. 9A, FIG. 9B, FIG. 9C, FIG. 9D, FIG. 9E and FIG. 9F illustrate cross-sectional views showing a method of fabricating a display device according to some embodiments of the present invention.

Referring to FIG. 9A, a first sensing dielectric layer IS-ILL a first conductive layer IS-CL1, and a second sensing dielectric layer IS-IL2 of an input sensing layer ISU may be sequentially formed or otherwise disposed on an encapsulation layer TFE that defines a first encapsulation region TFA1 and a second encapsulation region TFA2. In this case, the first sensing dielectric layer IS-IL1, the first conductive layer IS-CL1, and the second sensing dielectric layer IS-IL2 of the input sensing layer ISU may each have a shape that corresponds to that of the encapsulation layer TFE. For example, components of the input sensing layer ISU that correspond to the first encapsulation region TFA1 may have flat shapes, and components of the input sensing layer ISU that correspond to the second encapsulation region TFA2 may have curved shapes.

Figure 9B:
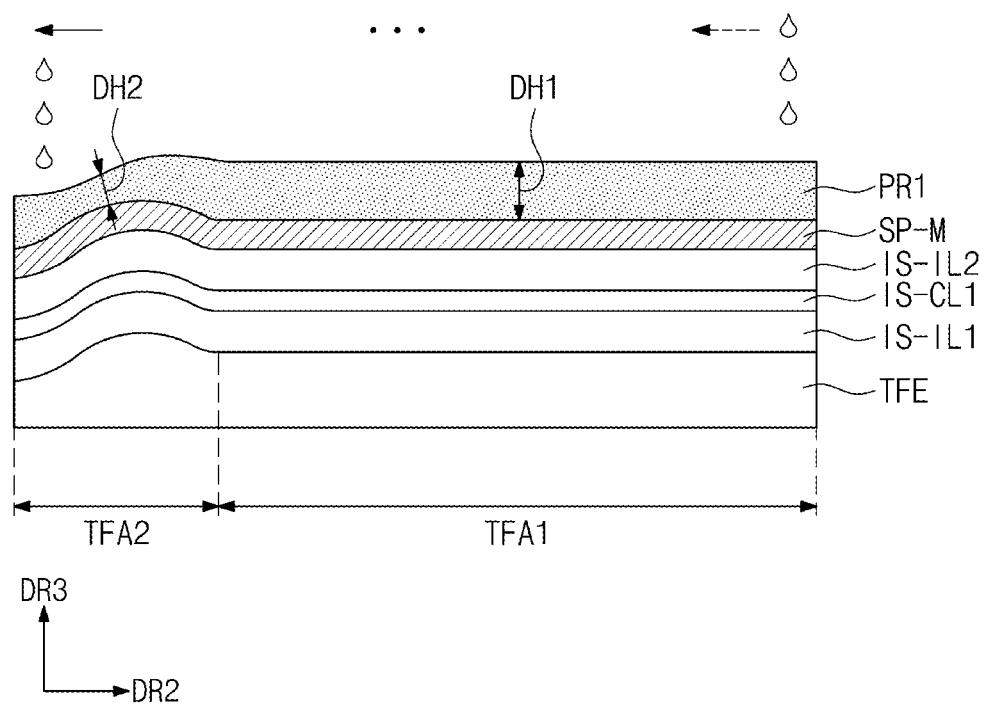

Referring to FIG. 9B, a conductive layer SP-M may be formed or otherwise disposed on the second sensing dielectric layer IS-IL2. The conductive layer SP-M may be formed by coating a conductive material on an entire top surface of the second sensing dielectric layer IS-IL2. The conductive layer SP-M may correspond to the second conductive layer IS-CL2 discussed in FIG. 5.

A photoresist layer may be formed or otherwise disposed to pattern the conductive layer SP-M. For example, according to that shown in FIG. 9B, a first photoresist layer PR1 may be formed on the conductive layer SP-M. On the conductive layer SP-M, the first photoresist layer PR1 may be formed or otherwise disposed to overlap each of the first and second encapsulation regions TFA1 and TFA2.

The first photoresist layer PR1 may be formed by coating a photosensitive solution on the conductive layer SP-M. When a photosensitive solution is coated on the conductive layer SP-M that overlaps the first encapsulation region TFA1 having a flat shape, the first photoresist layer PR1 may be formed to have a regular thickness. When a photosensitive solution is coated on the conductive layer SP-M that overlaps the second encapsulation region TFA2 having a curved shape, the first photoresist layer PR1 may not be formed to have a regular thickness.

For example, the first photoresist layer PR1 overlapping the first encapsulation region TFA1 may have a first thickness DH1, and the first photoresist layer PR1 overlapping the second encapsulation region TFA2 may include at least a portion having a second thickness DH2 less than the first thickness DH1. This may be because that a photosensitive solution for forming the first photoresist layer PR1 is coated in a liquid phase on the conductive layer SP-M.

When a photoresist layer has an irregular thickness, a conductive pattern or a patterned conductive layer may have an irregular line-width. As a result, detection reliability of external inputs may become poor.

Figure 9C:
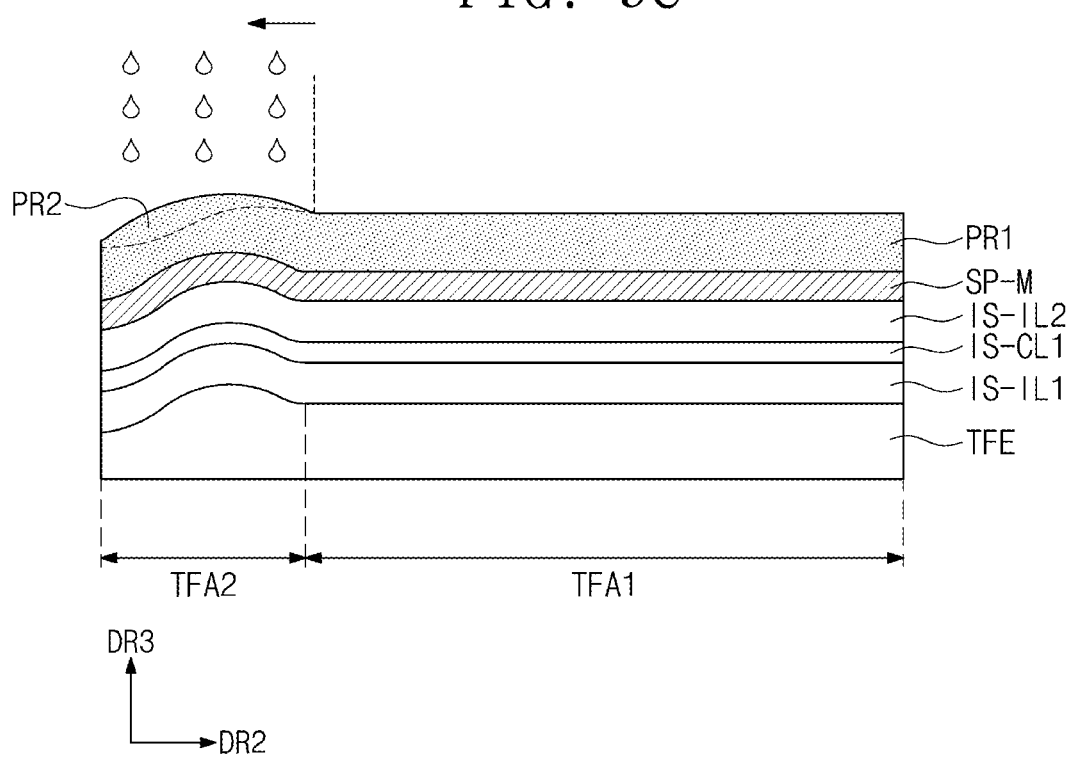

According to some embodiments of the present invention, as shown in FIG. 9C, a second photoresist layer PR2 may be formed on the first photoresist layer PR1 that overlaps the second encapsulation region TFA2. The second photoresist layer PR2 may compensate the irregular thickness of the first photoresist layer PR1, and may be formed by performing one or more times a process for coating a photosensitive solution.

As a result, a sum of thicknesses of the first and second photoresist layers PR1 and PR2 that overlap the second encapsulation region TFA2 may be substantially similar to a thickness of the first photoresist layer PR1 that overlaps the first encapsulation region TFA1.

Alternatively, a sum of thicknesses of the first and second photoresist layers PR1 and PR2 that overlap the second encapsulation region TFA2 may be greater than a thickness of the first photoresist layer PR1 that overlaps the first encapsulation region TFA1. This is a case where the second conductive pattern SP-S has a line-width greater than that of the first conductive pattern SP-C as discussed above with reference to FIG. 8A.

In addition, according to that discussed with reference to FIG. 8B, the second part S2 of the second conductive pattern SP-S may have a line-width greater than that of the first part S1 of the second conductive pattern SP-S. In this case, a sum of thicknesses of the first and second photoresist layers PR1 and PR2 that overlap the second part S2 may be greater than a sum of thicknesses of the first and second photoresist layers PR1 and PR2 that overlap the first part S1.

Figure 9D:
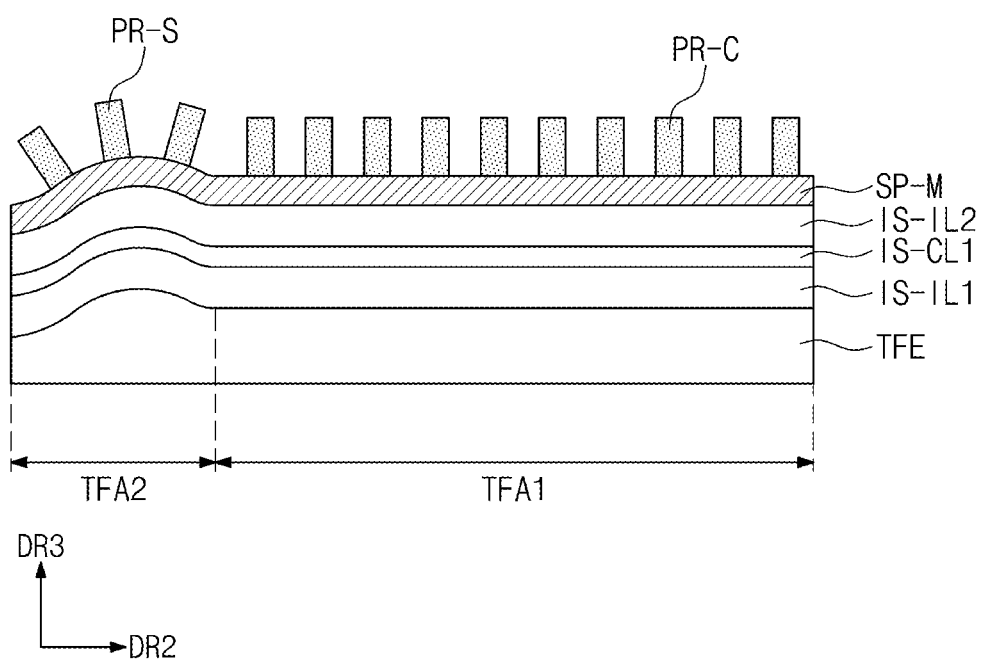

Referring to FIG. 9D, a pre-patterned mask may be used to expose and develop the first photoresist layer PR1 and the second photoresist layer PR2. Accordingly, a first pattern PR-C may be formed to overlap the first encapsulation region TFA1, and a second pattern PR-S may be formed to overlap the second encapsulation region TFA2.

Figure 9E:
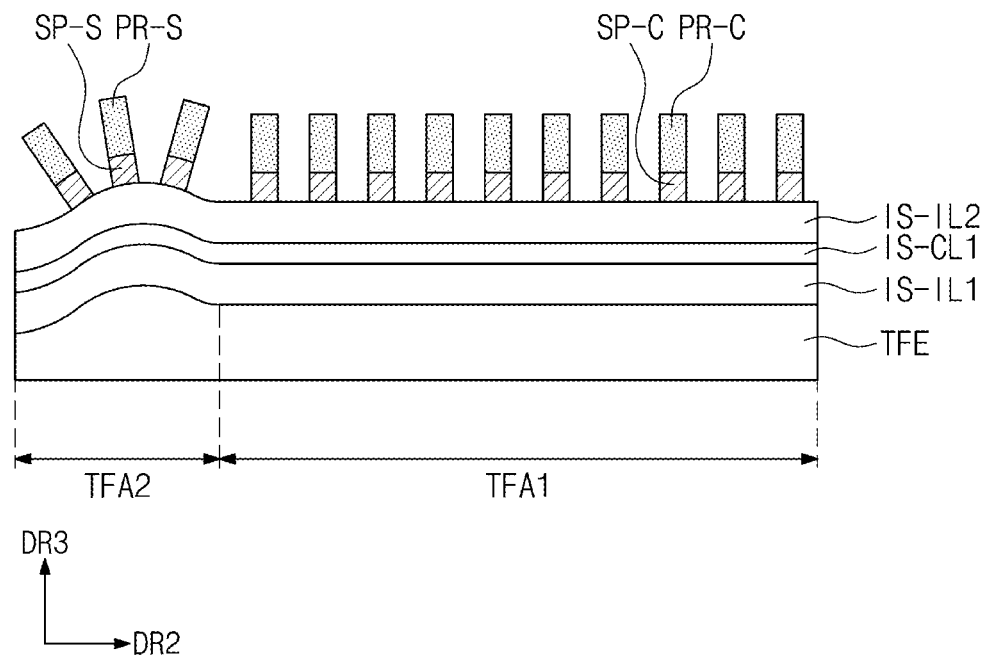

Referring to FIG. 9E, the conductive layer SP-M may be etched based on the first pattern PR-C and the second pattern PR-S. As a result, the conductive layer SP-M may be formed into a first conductive pattern SP-C that overlaps the first encapsulation region TFA1 and into a second conductive pattern SP-S that overlaps the second encapsulation region TFA2.

Figure 9F:
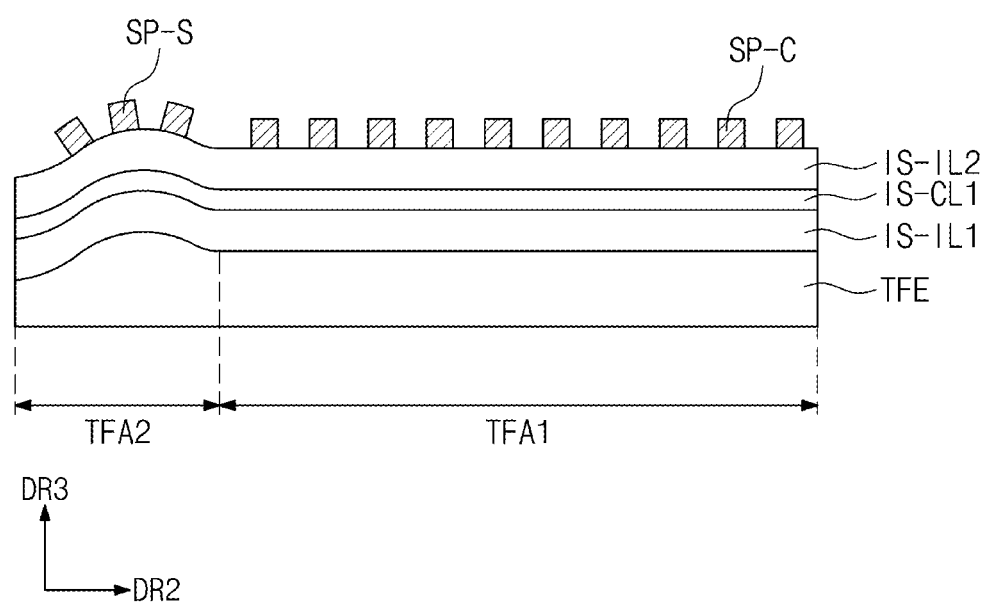

Referring to FIG. 9F, the first pattern PR-C and the second pattern PR-S may be removed to leave the first and second conductive patterns SP-C and SP-S on the second sensing dielectric layer IS-IL2.

According to some embodiments of the present invention, various line-widths may be provided to a conductive pattern of an input sensing layer that overlaps an encapsulation layer having a curved shape. Therefore, it may be possible to increase detection reliability of external inputs sensed from a window that corresponds to the encapsulation region having the curved shape.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of fabricating a display device, the method comprising:

forming a dielectric layer on an encapsulation layer of a display panel, the encapsulation layer including a first encapsulation region and a second encapsulation region adjacent to the first encapsulation region;

forming a conductive layer on the dielectric layer;

forming a first photoresist layer on the conductive layer that overlaps each of the first encapsulation region and the second encapsulation region;

forming a second photoresist layer on the first photoresist layer that overlaps the second encapsulation region; and etching the conductive layer based on the first photoresist layer and the second photoresist layer, wherein the display panel includes a display region for displaying image and a peripheral region surrounding the display region, and the first encapsulation region and the second encapsulation region are defined within the display region, wherein the second encapsulation region is disposed between the first encapsulation region and the peripheral region when viewed in a plan, wherein, when viewed in a thickness direction of the display panel, at least a portion of the encapsulation layer that overlaps the second encapsulation region has a thickness greater than a thickness of the encapsulation layer that overlaps the first encapsulation region.

2. The method of claim 1, wherein the second photoresist layer is formed by coating one or more times a photosensitive solution on the first photoresist layer that overlaps the second encapsulation region.

3. The method of claim 1, further comprising:

using a mask to expose the first photoresist layer and the second photoresist layer; and developing the exposed first and second photoresist layers, wherein the conductive layer is etched to form a first conductive pattern that overlaps the first encapsulation region and a second conductive pattern that overlaps the second encapsulation region.

4. The method of claim 3, wherein at least a portion of the second conductive pattern has a line-width greater than a line-width of the first conductive pattern, and a sum of thicknesses of the first and second photoresist layers that overlap the at least a portion of the second conductive pattern is greater than a thickness of the first photoresist layer that overlaps the first encapsulation region.

5. The method of claim 3, wherein the second conductive pattern includes:

a first part that has a first line-width; and a second part that has a second line-width greater than the first line-width, wherein a sum of thicknesses of the first and second photoresist layers that overlap the second part is greater than a sum of thicknesses of the first and second photoresist layers that overlap the first part.

6. The method of claim 5, wherein the first part is closer than the second part to the first conductive pattern.

7. The method of claim 1, wherein the display panel defines the display region and the peripheral region adjacent to the display region, and the encapsulation layer is formed to overlap the display region.

8. The method of claim 7, wherein, when viewed in plan, the second encapsulation region is closer than the first encapsulation region to the peripheral region.

9. The method of claim 1, wherein the first encapsulation region has a planar area greater than a planar area of the second encapsulation region.

10. The method of claim 1, wherein, when viewed in plan, the second encapsulation region encloses the first encapsulation region.

11. The method of claim 3, wherein the first conductive pattern that overlaps the first encapsulation region has a plurality of first regions that each extend upward from the dielectric layer in a direction parallel to each other, and wherein the second conductive pattern that overlaps the second encapsulation region has a plurality of second regions that each extend upward from the dielectric layer in a direction that is not parallel to each other.

* * * * *